(12) United States Patent
Park et al.

(10) Patent No.: US 7,163,719 B2
(45) Date of Patent: Jan. 16, 2007

(54) METHOD OF DEPOSITING THIN FILM USING HAFNIUM COMPOUND

(75) Inventors: Young Hoon Park, Pyungtaek (KR); Cheol Hyun Ahn, Pyungtaek (KR); Sang Jin Lee, Pyungtaek (KR); Byoung Cheol Cho, Pyungtaek (KR); Sang Kwon Park, Pyungtaek (KR); Hong Joo Lim, Pyungtaek (KR); Sang Kyu Lee, Pyungtaek (KR); Jang Ho Bae, Pyungtaek (KR)

(73) Assignee: IPS, Ltd. (KR)

( * ) Notice: Subject to any disclaimer, the term of this patent is extended or adjusted under 35 U.S.C. 154(b) by 420 days.

(21) Appl. No.: 10/712,876

(22) Filed: Nov. 12, 2003

(65) Prior Publication Data
US 2004/0105935 A1 Jun. 3, 2004

(30) Foreign Application Priority Data
Nov. 12, 2002 (KR) ............... 10-2002-0070054

(51) Int. Cl.
*C23C 16/40* (2006.01)
(52) U.S. Cl. .................. 427/255.29; 427/255.31; 427/255.7
(58) Field of Classification Search ........... 427/255.29, 427/255.31
See application file for complete search history.

(56) References Cited

U.S. PATENT DOCUMENTS

| | | | | |
|---|---|---|---|---|
| 6,348,373 B1 * | 2/2002 | Ma et al. | ............ | 438/240 |
| 6,780,476 B1 * | 8/2004 | Horikawa | ............ | 427/585 |
| 6,784,507 B1 * | 8/2004 | Wallace et al. | ............ | 257/410 |
| 6,852,194 B1 * | 2/2005 | Matsushita et al. | .... | 156/345.32 |
| 6,982,230 B1 * | 1/2006 | Cabral et al. | ............ | 438/778 |
| 2003/0101938 A1 * | 6/2003 | Ronsse et al. | ............ | 118/726 |
| 2003/0232501 A1 * | 12/2003 | Kher et al. | ............ | 438/689 |
| 2005/0064207 A1 * | 3/2005 | Senzaki et al. | ............ | 428/446 |

\* cited by examiner

*Primary Examiner*—Bret Chen
(74) *Attorney, Agent, or Firm*—Cantor Colburn LLP

(57) ABSTRACT

A method of depositing a thin film using a hafnium compound includes depositing a primary thin film and depositing a secondary thin film. The depositing of the primary thin film and the depositing of the secondary thin film are repeated once or more. The depositing of the primary thin film includes feeding a first reactive gas, purging the first reactive gas, feeding a third reactive gas, and purging the third reactive gas, and repeating the aforementioned steps a first plurality of (N) times. The feeding of the first reactive gas includes feeding a second reactive gas, purging the second reactive gas, feeding the third reactive gas, and purging the third reactive gas, and repeating the aforementioned steps a second plurality of (M) times.

17 Claims, 4 Drawing Sheets

METHOD OF DEPOSITING THIN FILM USING HAFNIUM COMPOUND

This application claims the priority of Korean Patent Application No. 2002-70054, filed on Nov. 12, 2002, in the Korean Intellectual Property Office, the disclosure of which is incorporated herein in its entirety by reference.

BACKGROUND OF THE INVENTION

1. Field of the Invention

The present invention relates to a method of depositing a thin film using a hafnium compound on a wafer. More particularly, the present invention relates to a method of depositing a $HfSi_xO_y$ thin film or a $HfO_2$ thin film on a wafer using tetra ethyl methyl amino hafnium (TEMAH), tetra methyl di siloxane (TMDSO), hexa methyl di silane (HMDS), $H_2O$, and $O_3$.

2. Description of the Related Art

Nowadays, there has been laborious research for using large-diameter wafers and reducing the design rule in order to lower the unit cost of production. Thus, thin films formed of high-k dielectric materials are required for forming capacitors and gates used in semiconductor devices.

SUMMARY OF THE INVENTION

The present invention provides a method of depositing a thin film using a hafnium compound on a wafer, which allows deposition of a high-k dielectric thin film so as to shrink the size of semiconductor devices.

In accordance with an aspect of the present invention, there is provided a method of depositing a thin film using a hafnium compound, in which a hafnium silicate ($HfSi_xO_y$) thin film is deposited on a wafer using a reaction chamber comprising a reactor block in which a wafer block is received; a top lid for covering the reactor block to maintain a predetermined pressure; and a shower head installed under the top lid and including a plurality of first spray holes for spraying a first reactive gas on the wafer, a plurality of second spray holes for spraying a second reactive gas on the wafer, and a plurality of third spray holes for spraying a third reactive gas on the wafer. The method of the present invention comprises (S100) mounting the wafer on the wafer block; and (S200) depositing the $HfSi_xO_y$ film by spraying reactive gases on the wafer.

Step (S200) comprises (S20) depositing a primary thin film; and (S21) depositing a secondary thin film and is performed by repeating step (S20) and step (S21) once or more.

Step (S20) may comprise (S20-1) feeding the first reactive gas by spraying TEMAH($Hf((C_2H_5)(CH_3)N)_4$)) as the first reactive gas on the wafer through the first spray holes; (S20-2) purging the first reactive gas by spraying an inert gas through all the spray holes of the shower head; (S20-3) feeding the third reactive gas by spraying one of $O_3$ and $H_2O$ as the third reactive gas on the wafer through the third spray holes; and (S20-4) purging the third reactive gas by spraying the inert gas through all the spray holes of the shower head. Also, step (S20) may be performed by repeating steps (S20-1), (S20-2), (S20-3), and (S20-4) N times.

Step (S21) may comprise (S21-1) feeding the second reactive gas by spraying one of TMDSO($O(Si(CH_3)_2H)_2$) and HMDS($((CH_3)_3)Si)_2$) as the second reactive gas on the wafer through the second spray holes; (S21-2) purging the second reactive gas by spraying the inert gas through all the spray holes of the shower head; (S21-3) feeding the third reactive gas by spraying one of $O_3$ and $H_2O$ on the wafer through the third spray holes; and (S21-4) purging the third reactive gas by spraying the inert gas is sprayed through all the spray holes of the shower head. Also, step (S21) may be performed by repeating steps (S21-1), (S21-2), (S21-3), and (S21-4) M times.

Herein, while a corresponding reactive gas is being sprayed through one of the first spray holes, the second spray holes, and the third spray holes, the inert gas may be sprayed through the other two types of spray holes.

The inert gas may be sprayed through a plurality of gas curtain holes, which are further included in the shower head, toward the inner sidewalls of the reactor block so as to minimize deposition of the thin film on the inner sidewalls of the reactor block. Step (S200) may be performed while the inert gas is being sprayed through the gas curtain holes.

The first spray holes for spraying the first reactive gas may be identical to the second spray holes for spraying the second reactive gas.

In accordance with another aspect of the present invention, there is provided a method of depositing a thin film using a hafnium compound, in which a hafnium oxide ($HfO_2$) thin film on a wafer using a reaction chamber comprising a reactor block in which a wafer block is received; a top lid for covering the reactor block to maintain a predetermined pressure; and a shower head installed under the top lid and including a plurality of first spray holes for spraying a first reactive gas on the wafer, a plurality of second spray holes for spraying a second reactive gas on the wafer, and a plurality of gas curtain holes for spraying an inert gas toward the inner sidewalls of the reactor block so as to minimize deposition of the thin film on the inner sidewalls of the reactor block. The method of the present invention comprises (S1) mounting the wafer on the wafer block; and (S2) depositing the $HfO_2$ film by spraying reactive gases on the wafer.

Step (S2) may be performed while the inert gas is being sprayed through the gas curtain holes toward the inner sidewalls of the reactor block so as to minimize deposition of the thin film on the inner sidewalls of the reactor block. Also, step (S2) may comprise (S2-1) feeding the first reactive gas by spraying TEMAH ($Hf((C_2H_5)(CH_3)N)_4$)) as the first reactive gas on the wafer through the first spray holes; (S2-2) purging the first reactive gas by spraying the inert gas through all the spray holes of the shower head; (S2-3) feeding the second reactive gas by spraying one of $O_3$ and $H_2O$ as the second reactive gas on the wafer through the second spray holes; and (S2-4) purging the second reactive gas by spraying the inert gas through all the spray holes of the shower head. Also, step (S2) may be performed by repeating steps (S2-1), (S2-2), (S2-3), and (S2-4) once or more.

Herein, while a corresponding reactive gas is being sprayed through one of the first spray holes and the second spray holes, the inert gas may be sprayed through the other type of spray holes.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Hereinafter, a method of depositing a thin film using a hafnium compound according to the present invention will now be described more fully with reference to the accompanying drawings, in which preferred embodiments of the invention are shown.

Figure 1:
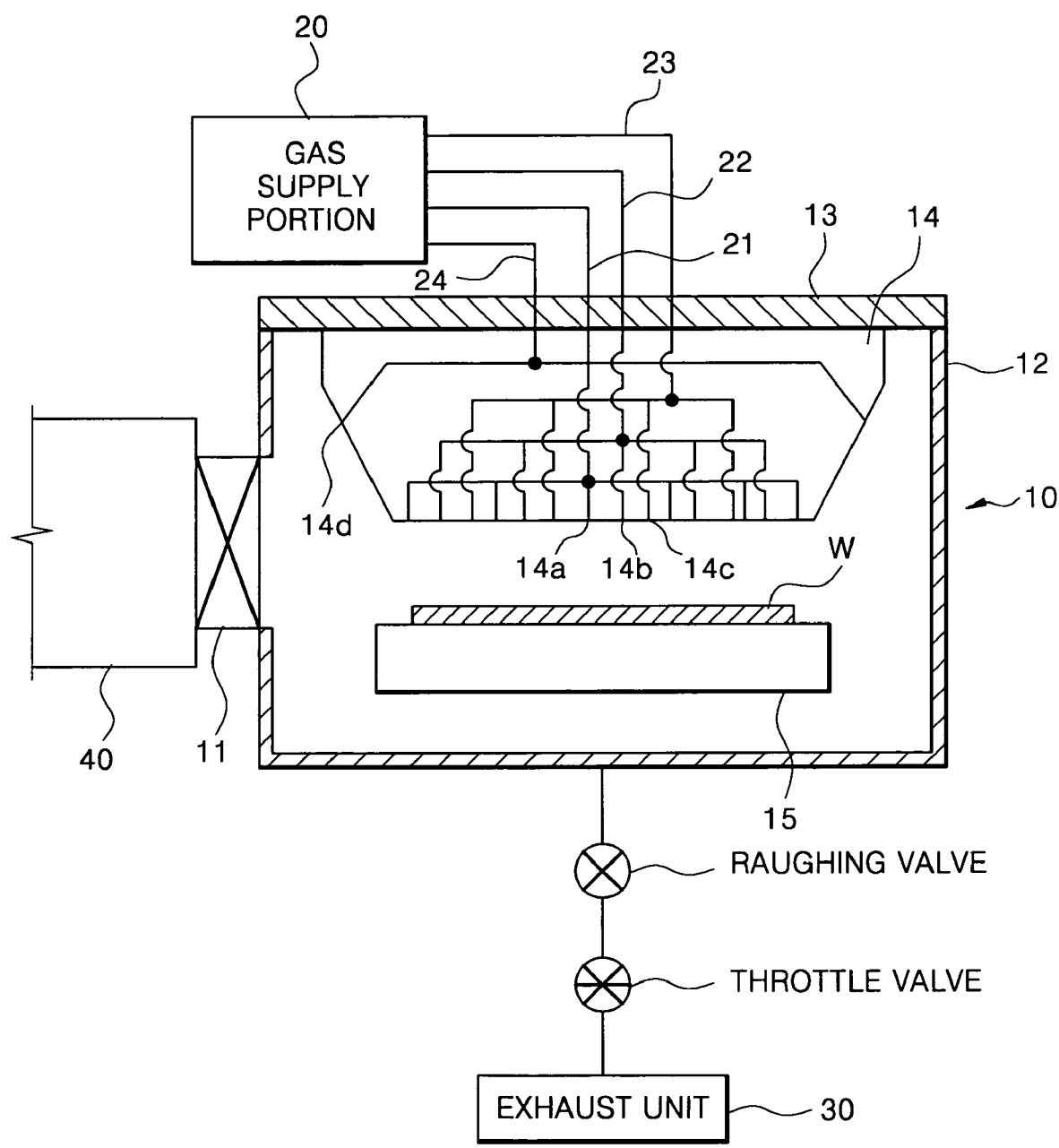
FIG. 1 is a construction diagram of a thin film deposition apparatus in which a method of depositing a thin film using a hafnium compound is performed according to an embodiment of the present invention.
Figure 2:
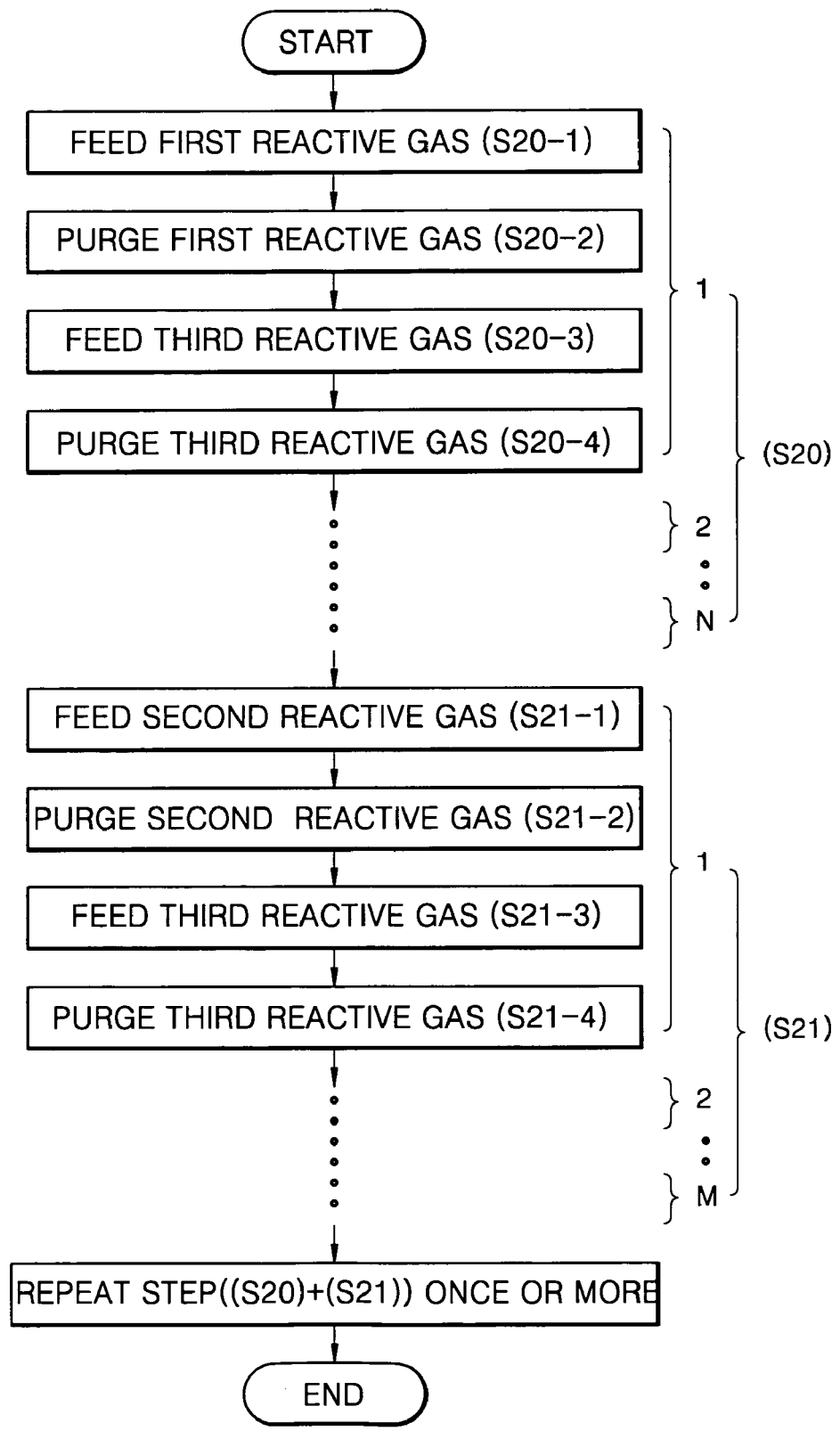
FIG. 2 is a flowchart illustrating the depositing of a thin film in the method of FIG. 1.

FIG. 1 is a construction diagram of a thin film deposition apparatus in which a method of depositing a thin film using a hafnium compound is performed according to an embodiment of the present invention. FIG. 2 is a flowchart illustrating the depositing of a thin film in the method of FIG. 1.

In the present embodiment, hafnium silicate ($HfSi_xO_y$) is deposited on a wafer. As shown in FIG. 1, a thin film deposition apparatus used for embodying the method of the present embodiment comprises a reaction chamber 10 in which a wafer w is loaded, a gas supply portion 20 for supplying two or more reactive gases and/or an inert gas to the reaction chamber 10, an exhaust unit 30 for exhausting gases from the reaction chamber, and a transfer module 40 for loading the wafer w into/out of the reaction chamber 10.

The reaction chamber 10 comprises a reactor block 12 in which a wafer block 15 is received, a top lid 13 for covering the reactor block 12 to maintain a predetermined pressure, a shower head 14 installed under the top lid 13 and for spraying the reactive gases and/or the inert gas.

The shower head 14 comprises a plurality of first spray holes 14a for spraying a first reactive gas to the top surface of the wafer w, a plurality of second spray holes 14b for spraying a second reactive gas to the top surface of the wafer w, and a plurality of third spray holes 14c for spraying a third reactive gas to the top surface of the wafer 2. Further, the shower head 14 comprises a plurality of gas curtain holes 14d for spraying an inert gas toward the inner sidewalls of the reactor block 12 so as to minimize deposition of the thin film on the inner sidewalls of the reactor block 12. Here, each of the first, second, and third spray holes 14a, 14b, and 14c does not contact the gas curtain holes 14d. Also, the first spray holes 14a, the second spray holes 14b, and the third spray holes 14c are separated by a predetermined distance from each other. Also, the gas curtain holes 14d are separated by a predetermined distance from each other. The inert gas is sprayed through the gas curtain holes 14d and forms a gas curtain to minimize deposition of the thin film on the inner sidewalls of the reaction chamber 10. Thus, a cleaning cycle of the reaction chamber 10 can be extended.

The wafer block 15, on which the wafer w is placed, is used to heat the wafer w to a predetermined temperature.

A first gas line 21, which diverges from the gas supply portion 20 to supply the first reactive gas, is connected to the first spray holes 14a, a second gas line 22 for supplying the second reactive gas is connected to the second spray holes 14b, and the third gas line 23 for supplying the third reactive gas is connected to the third spray holes 14c. Also, an inert gas line 24 for supplying the inert gas is connected to the gas curtain holes 14d. An MFC, opening and closing valves, and the likes, which are installed in the gas supply portion 20, control the flow rates of the reactive gases and the inert gas and supply them through required gas lines to the reaction chamber 10.

The reaction chamber 10 is connected to the transfer module 40 by a VAT valve 11, and a robot arm (not shown) transfers the wafer w from the transfer module 40 through the VAT valve 11 to the reaction chamber 10.

Next, a method of depositing a $HfSi_xO_y$ thin film on the wafer w using the foregoing thin film deposition apparatus will be described. It will be noted that use of the terms "M times" and "N times" throughout the specification means a first plurality of (M) times and a second plurality of (N) times respectively, where M and N are each whole numbers that may be different or the same number as each other.

The depositing of the $HfSi_xO_y$ thin film on the wafer w comprises (S100) mounting the wafer w on the wafer block 15 and (S200) depositing the $HfSi_xO_y$ thin film by spraying reactive gases on the wafer w.

In step S100, the robot arm (not shown) loads the wafer w out of the transfer module 40 and loads the wafer w into the reaction chamber 10, thereby mounting the wafer w on the wafer block 15. In this step, the wafer should be previously heated to a sufficient temperature for the entire thin film deposition process.

In step (S200), TEMAH ($Hf((C_2H_5)(CH_3)N)_4$)) is used as the first reactive gas, one of TMDSO ($O(Si(CH_3)_2H)_2$) and HMDS ($CH_3(_3Si)_2$) is used as the second reactive gas, and one of $H_2O$, and $O_3$ is used as the third reactive gas. Here, an inert gas is supplied to respective canisters and bubbles different types of liquid materials, which are contained in the canisters, thus generating the first reactive gas and the second reactive gas.

Step (S200) comprises (S20) depositing a primary thin film and (S21) depositing a primary thin film and is performed by repeating steps (S20) and (S21) once or more. Step (S20) comprises (S20-1) feeding the first reactive gas, (S20-2) purging the first reactive gas, (S20-3) feeding the third reactive gas, and (S20-4) purging the third reactive gas. Step (S21) comprises (S21-1) feeding the second reactive gas, (S21-2) purging the second reactive gas, (S21-3) feeding the third reactive gas, and (S21-4) purging the third reactive gas. Here, step (S20) is performed by repeating (S20-1), (S20-2), (S20-3), and (S20-4) N times, and step (S21) is performed by repeating (S21-1), (S21-2), (S21-3), and (S21-4) M times.

In step (S20-1), a mixture of the inert gas and the first reactive gas is sprayed on the wafer w through the first spray holes 14a.

In step (S20-2), the feeding of the first reactive gas is stopped, and the remaining first reactive gas, which exists in the reaction chamber 10 but does not absorb on the wafer w, is purged. In this step, the inert gas is fed into the reaction chamber 10 through all the spray holes, and the purged first reactive gas is exhausted through the exhaust unit 30.

In step (S20-3), the third reactive gas is sprayed on the wafer w through the third spray holes 14c.

In step (S20-4), the inert gas is fed into the reaction chamber 10 through all the spray holes. In this step, gases, which are not used for depositing a thin film and obtained as by-products after chemical reactions, are exhausted from the reaction chamber 10.

As described above, in step (S20), an atomic layer deposition (ALD) cycle of steps (S20-1), (S20-2), (S20-3), and (S20-4) is performed N times. As a result, a primary thin film is formed on the wafer w.

In step (S21) performed after step (S20), step (S21-1) is performed by spraying the second reactive gas on the wafer w through the second spray holes 14b.

In step (S21-2), the feeding of the second reactive gas is stopped, and the remaining second reactive gas, which exists in the reaction chamber 10 but does not absorb on the wafer w, is purged. In this step, the inert gas is fed into the reaction chamber 10 through the second spray holes 14b, and the purged second reactive gas is exhausted through the exhaust unit 30.

In step (S21-3), the third reactive gas is fed into the reaction chamber 10 through the third spray holes 14c. In step (S21-4), the inert gas is fed into the reaction chamber 10 through all the spray holes.

As described above, in step (S21), a cycle of steps (S21-1), (S21-2), (S21-3), and (S21-4) is performed M times. As a result, a secondary thin film is formed on the primary thin film.

Briefly, step (S200), which comprises depositing a $HfO_2$ monatomic film N times and depositing a $SiO_2$ monatomic film M times, is performed once or more.

Step (S20) and step (S21) are sequentially performed. To complete a thin film to a desired thickness, step (S200 =S20 +S21) is performed once or more. Although step (S20) is followed by step (S21) in the present embodiment, step (S21) may be followed by step (S20).

Preferably, the inert gas is sprayed through the gas curtain holes 14d of the shower head 14 toward the inner sidewalls of the reactor block 12 so as to minimize deposition of the thin film on the inner sidewalls of the reactor block 12. That is, the inert gas is sprayed during the feeding and purging steps of the reactive gases. Also, the gas curtain holes 14d spray the inert gas, which forms a gas curtain to minimize deposition of the thin film on the inner sidewalls of the reaction chamber 10. Thus, a cleaning cycle of the reaction chamber 10 can be extended.

In the present embodiment, the first gas line 21 and the second gas line 22 are connected to the first spray holes 14a and the second spray holes 14b, respectively, which are separated from each other. However, the first gas line 21 and the second gas line 22 may be commonly connected irrespective of the first and second spray holes. That is, the first gas line 21 and the second gas line 22, which divert form the gas supply portion 20, may be connected to the common spray holes. In this case, the foregoing ALD steps can be similarly carried out except that it takes a longer amount of time to purge the remaining gases than when three types of spray holes 14a, 14b, and 14c are used, in order to prevent generation of particles.

Also, when a reactive gas is sprayed through one of the first, second, and third spray holes 14a, 14b, and 14c, the inert gas is sprayed through the other two types of spray holes, thereby preventing the reactive gas from flowing back through the gas lines and improving the uniformity of the resultant thin film.

Further, in the present embodiment, the concentration of each component constituting the thin film formed on the wafer w can be positionally held constant, thereby improving the reproducibility of resultant thin films.

Before the present invention was developed, the inventor had performed the following steps: feeding a first reactive gas (Hf source), purging a reaction chamber, feeding a second reactive gas (Si source), purging the second reactive gas, feeding a third reactive gas (oxide gas), and purging the third reactive gas. As a result, controlling the composition ratio of Hf: Si: O in a thin film was very difficult. Further, the reproducibility of resultant thin films was markedly lowered. That is, in this ALD method, it was very complicated to control the composition ratio of Hf: Si: O according to the structure of a reaction chamber and the temperature condition. Particularly, in this ternary tunnel ALD method, it was limited to increase the ratio of Si. Also, as compared with a binary tunnel ALD method, it was far more difficult to secure a high reproducibility, a high uniformity of a thin film, and a positionally constant concentration of each component constituting the thin film in the triple system ALD method.

Therefore, the inventor has proposed the present embodiment as described above. That is, step (S200) comprises step (S20) of depositing the primary thin film, in which a cycle of (S20-1) feeding the first reactive gas, (S20-2) purging the first reactive gas, (S20-3) feeding the third reactive gas, and (S20-4) purging the third reactive gas is performed N times, and step (S21) of depositing the secondary thin film, in which a cycle of (S21-1) feeding the second reactive gas, (S21-2) purging the second reactive gas, (S21-3) feeding the third reactive gas, and (S21-4) purging the third reactive gas is performed M times. Also, the entire step (S200) is performed by repeating steps (S20) and (S21) once or more. As a result, it is possible to control the composition ratio of Hf:Si:O while changing the recipe and also to control the Si ratio in the thin film.

Preferably, considering the decomposition temperature of the first reactive gas (i.e., $Hf((C_2H_5)(CH_3)N)_4$) or the second reactive gas (i.e., $O(Si(CH_3)_2H)_2$ or $((CH_3)_3)Si)_2$), the wafer w mounted on the wafer block 15 is heated at a temperature of approximately 80° C. to 600° C. In the present embodiment, the wafer w is kept at a temperature of approximately 200° C.

Also, considering the decomposition temperatures of the first reactive gas and the second reactive gas, the first gas line 21 and the second gas line 22, which are used for transferring the first and second reactive gases to the reaction chamber 10, are preferably heated at a temperature of approximately 200° C. or less. Further, the third gas line 23, which is used for transferring the third reactive gas ($O_3$ or $H_2O$), is similarly heated at a temperature of approximately 200° C. or less. In the present embodiment, the first, second, and third gas lines 21, 22, and 23 are held at approximately 100° C.

Meanwhile, throughout step (S200), the reaction chamber 10 is held at a pressure of approximately 0.1 Torr to 10 Torr. In the present embodiment, the reaction chamber 10 is held at approximately 1 Torr.

Also, the canisters, in which the liquid materials of the first and second reactive gases are contained, are heated at a temperature of approximately 18° C. to 150° C. In the present embodiment, the canisters are held at approximately 70° C.

Hereinafter, a method of depositing a thin film using a hafnium compound according to another embodiment of the present invention will be described.

Figure 3:
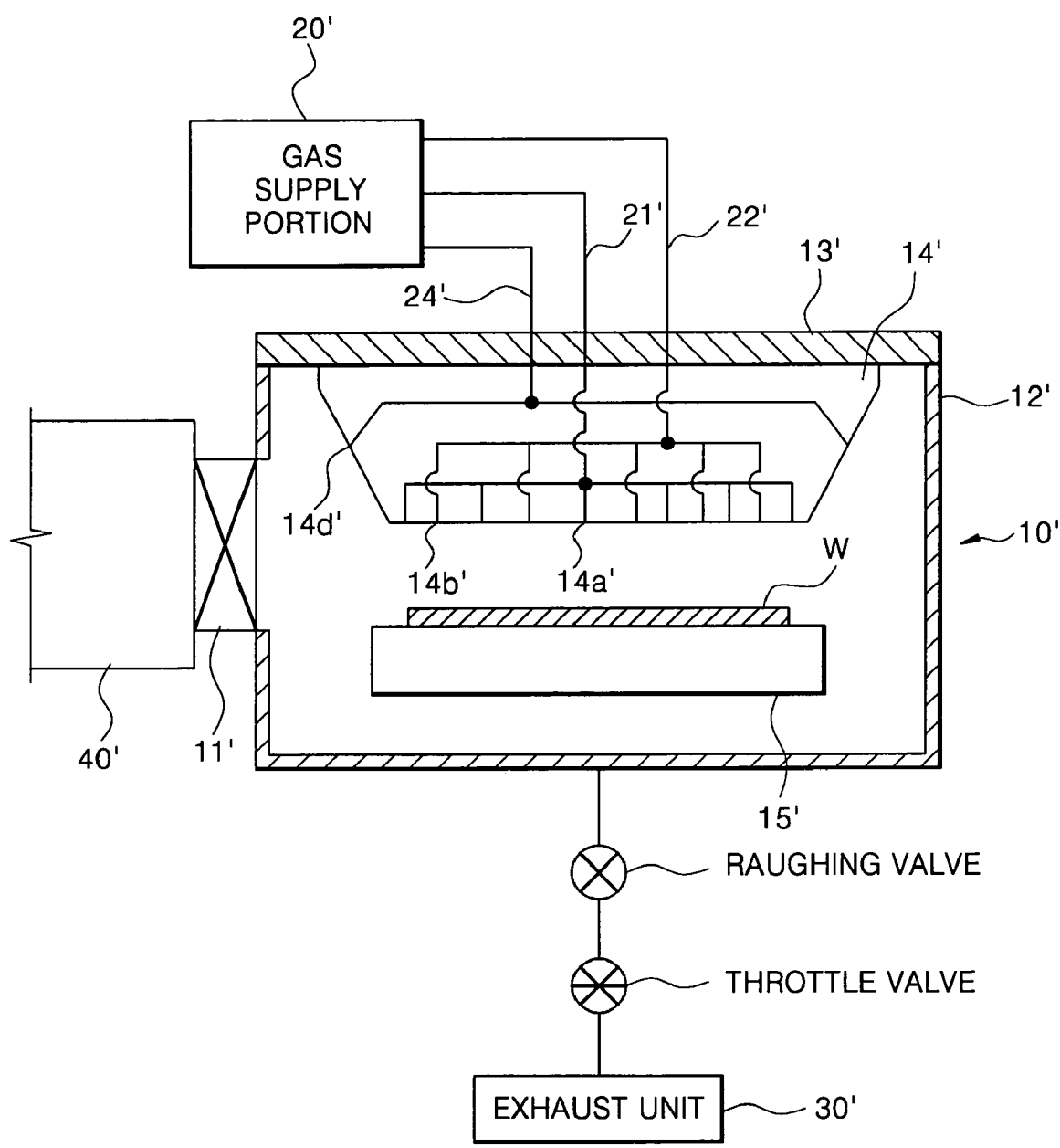
FIG. 3 is a construction diagram of a thin film deposition apparatus in which a method of depositing a thin film using a hafnium compound is performed according to another embodiment of the present invention.

FIG. 3 is a construction diagram of a thin film deposition apparatus, in which the method of depositing a thin film using a hafnium compound is performed according to another embodiment of the present invention. In the present embodiment, hafnium oxide ($HfO_2$) is deposited on a wafer. As shown in FIG. 3, the thin film deposition apparatus for embodying the method of the present embodiment comprises a reaction chamber 10' in which a wafer w is loaded and a thin film is deposited, a gas supply portion 20' for supplying two or more reactive gases and/or an inert gas to the reaction chamber 10', an exhaust unit 30' for exhausting gases from the reaction chamber 10', and a transfer module 40' for loading the wafer w into/out of the reaction chamber 10'.

The reaction chamber 10 comprises a reactor block 12' in which a wafer block 15' is received, a top lid 13' for covering the reactor block 15' to maintain a predetermined pressure, and a shower head 14' installed under the top lid 13' and for spraying the reactive gases and/or the inert gas.

The shower head 14' comprises a plurality of first spray holes 14a' for spraying a first reactive gas to the top surface of the wafer w, a plurality of second spray holes 14b' for spraying a second reactive gas to the top surface of the wafer w, and a plurality of gas curtain holes 14d' for spraying an inert gas toward the inner sidewalls of the reactor block 12 so as to minimize deposition of the thin film on the sidewalls of the reactor block 12. Here, each of the first and second spray holes 14a' and 14b' does not contact the gas curtain holes 14d'. Also, the first spray holes 14a', the second spray holes 14b', and the gas curtain holes 14d' are separated by a predetermined distance from each other.

The wafer block 15' is the same as in the first embodiment.

A first gas line 21' and a second gas line 22', which diverge from the gas supply portion 20', are connected to the first spray holes 14a' and the second spray holes 14b', respectively. An inert gas line 24' is connected to the gas curtain holes 14d'. Similarly to the first embodiment, an MFC, opening and closing valves, and the likes, which are installed in the gas supply portion 20', control the flow rates of the reactive gases and the inert gas and supply them through required gas lines to the reaction chamber 10'. Also, the reaction chamber 10' is connected to the transfer module 40' by a VAT valve 11' in the same manner as in the first embodiment.

Next, a method of depositing a $HfO_2$ thin film on the wafer w using the foregoing thin film deposition apparatus will be described.

The depositing of the $HfO_2$ thin film comprises (S1) mounting the wafer w on the wafer block 15' and (S2) depositing the $HfO_2$ thin film by spraying reactive gases on the wafer w.

In step (S1), a robot arm (not shown) loads the wafer w out of the transfer module 40' and loads the wafer w into the reaction chamber 10', thereby mounting the wafer w on the wafer block 15'. In this step, the wafer should be previously heated to a sufficient temperature for the entire thin film deposition process.

Step (S2) is performed while the inert gas is being sprayed through the gas curtain holes 14d' toward the inner sidewalls of the reactor block 12' so as to minimize deposition of the thin film on the inner sidewalls of the reactor block 12'. TEMAH ($Hf((C_2H_5)(CH_3)N)_4$)) is used as the first reactive gas, and one of $H_2O$, and $O_3$ is used as the second reactive gas. Here, the inert gas is supplied to a canister and bubbles liquid materials, which are contained in the canister, thus generating the first reactive gas. Step (S2) will be described in more detail hereinafter.

After the wafer w is previously heated to a temperature required for the entire thin film deposition process, initially, (S2-1) feeding the first reactive gas is performed. In this step, a mixture of the inert gas and the first reactive gas (TEMAH) is fed into the reaction chamber 10' and sprayed on the wafer w through the first spray holes 14a'.

Next, (S2-2) purging the first reactive gas is performed. In this step, the feeding of the first reactive gas is stopped, and the remaining first reactive gas, which exists in the reaction chamber 10' but does not absorb on the wafer w, is purged. In this step, the inert gas is fed into the reaction chamber 10' through all the spray holes, and the purged first reactive gas is exhausted through the exhaust unit 30'.

Next, (S20-3) feeding the second reactive gas is performed. In this step, the second reactive gas is fed into the reaction chamber 10' and sprayed on the wafer w through the second spray holes 14b'. In this step, the second reactive gas reacts on the first reactive gas, thus depositing a $HfO_2$ thin film on the wafer w, and gases, which are not used for depositing a thin film and obtained as by-products after chemical reactions, are exhausted from the reaction chamber 10'.

Next, (S2-4) purging the second reactive gas is performed. In this step, the second reactive gas remaining in the reaction chamber 10' is purged by feeding the inert gas into the reaction chamber 10' through all the spray holes. As a result, the second reactive gas, which are not used for the deposition of the thin film, and the gases obtained as by-products after chemical reactions are exhausted from the reaction chamber 10'.

An ALD includes steps (S2-1), (S2-2), (S2-3), and (S2-4), which are sequentially performed, and is repeated once or more in order to deposit a thin film to a required thickness. Here, during the feeding and purging steps of the reactive gases, the inert gas are sprayed through the gas curtain holes 14d' and forms a gas curtain to minimize deposition of the thin film on the inner sidewalls of the reaction chamber 10'. Thus, a cleaning cycle of the reaction chamber 10' can be extended. Also, when a reactive gas is sprayed through one of the first and second spray holes 14a' and 14b', the inert gas is sprayed through the other spray holes, thereby preventing the reactive gas from flowing back through the gas lines and improving the uniformity of the resultant thin film.

Preferably, considering the decomposition temperature of the first reactive gas (i.e., $Hf((C_2H_5)(CH_3)N)_4$) and the purging time, the wafer w mounted on the wafer block 15' is heated at a temperature of approximately 80° C. to 600° C. In the present embodiment, the wafer w is kept at a temperature of approximately 200° C.

Also, considering the decomposition temperatures of the first reactive gas, the first gas line 21' is preferably heated at a temperature of approximately 200° C. or less. Further, the second gas line 22', which is used for transferring $O_3$ or $H_2O$, is similarly heated at a temperature of approximately 200° C. or less. In the present embodiment, the first gas line 21' is held at approximately 100° C.

Meanwhile, in step (S2), the reaction chamber 10' is held at a pressure of approximately 0.1 Torr to 10 Torr. In the present embodiment, the reaction chamber 10' is held at approximately 1 Torr.

Also, the canister, in which the liquid materials of the first reactive gas are contained, is heated at a temperature of approximately 0° C. to 150° C. In the present embodiment, the canisters are held at approximately 70° C.

Figure 4:
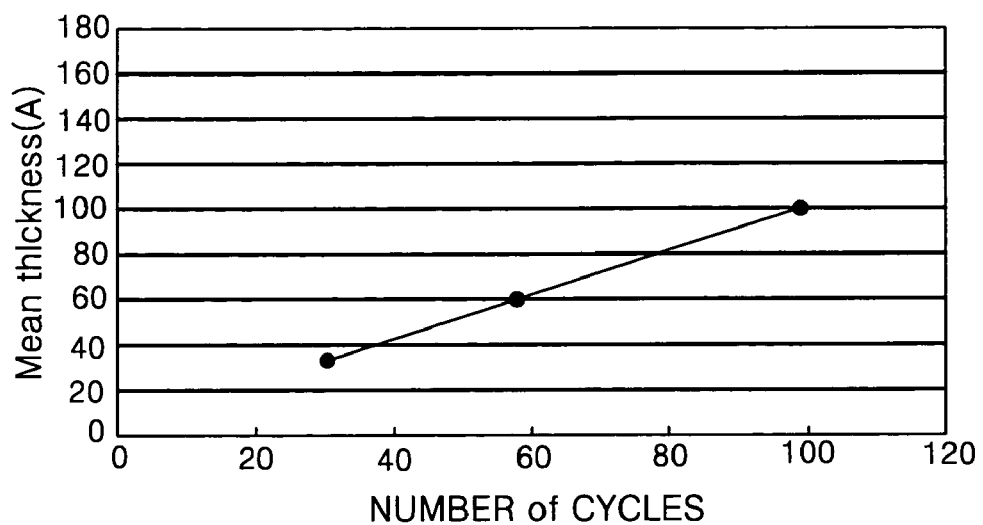
FIG. 4 is a graph showing that the thickness of a thin film is linearly proportional to the number of depositing cycles in the method of the present invention.

By repeating the ALD cycle, as shown in FIG. 4, the thickness of the $HfO_2$ thin film deposited on the wafer w is linearly proportional to the number of cycles.

Hereinafter, the mechanism of chemical reactions that are caused in the foregoing conditions will be described.

The depositing of a $HfO_2$ thin film using $O_3$ as the second reactive gas can be expressed as shown in the following equations (1-1) and (1-2).

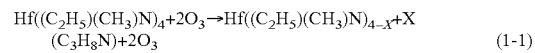

(1-1)

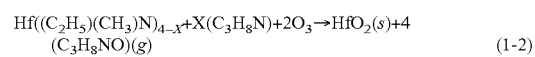

(1-2)

As shown in the equations (1-1) and (1-2), the first reactive gas (i.e., Hf(($C_2H_5$)($CH_3$)N)$_4$) and the second reactive gas (i.e., $O_3$) are sprayed into the reaction chamber 10 through the first gas line 21' and the second gas line 21', respectively. Among them, the first reactive gas decomposes into Hf(($C_2H_5$)($CH_3$)N)$_{4-X}$ and X($C_3H_8$N) (herein, X=1~4) as shown in the equation (1-1). Thereafter, as shown in the equation (1-2), Hf(($C_2H_5$)($CH_3$)N)$_{4-X}$ reacts on $O_3$, thus depositing a HfO$_2$ thin film on the wafer w. The remaining reactive gas, which is not used for the deposition of thin films, and the gases obtained as by-products after the chemical reactions are exhausted through the exhaust unit 30'.

The deposition of a HfO$_2$ thin film using H$_2$O as the second reactive gas can be expressed as shown in the following equations (2-1) and (2-2).

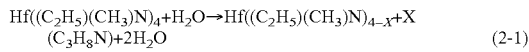
(2-1)

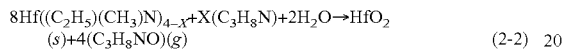
(2-2)

The first reactive gas (i.e., Hf(($C_2H_5$)($CH_3$)N)$_4$) and the second reactive gas (H$_2$O) are sprayed into the reaction chamber 10' through the first gas line 21' and the second gas line 22', respectively. Among them, the first reactive gas decomposes into Hf(($C_2H_5$)($CH_3$)N)$_{4-X}$ and X($C_3H_8$N) (X=1~4) as shown in the equation (2-1). Thereafter, as shown in the equation (2-2), Hf(($C_2H_5$)($CH_3$)N)$_{4-X}$ reacts on H$_2$O, thus depositing a HfO$_2$ thin film on the wafer w. The remaining reactive gas, which is not used for the deposition of thin films, and the gases obtained as by-products after the chemical reactions are exhausted through the exhaust unit 30'.

As explained thus far, the method of the present invention allows deposition of a high-k HfSi$_x$O$_y$ thin film or a high-k HfO$_2$ thin film so as to shrink the size of semiconductor devices. In particular, when the HfSi$_x$O$_y$ thin film is deposited, it is easy to control the concentration of each component constituting the thin film, and the uniformity of the thin film can be greatly enhanced.

What is claimed is:

1. A method of depositing a thin film using a hafnium compound on a wafer, the thin film being formed of HfSi$_x$O$_y$, using a reaction chamber comprising a reactor block in which a wafer block is received; a top lid for covering the reactor block to maintain a predetermined pressure; and a shower head installed under the top lid and including a plurality of first spray holes for spraying a first reactive gas on the wafer, a plurality of second spray holes for spraying a second reactive gas on the wafer, and a plurality of third spray holes for spraying a third reactive gas on the wafer, the method comprising:

mounting the wafer on the wafer block; and depositing the HfSi$_x$O$_y$ film by spraying reactive gases on the wafer, the depositing the HfSi$_x$O$_y$ film comprising:

depositing a primary thin film; and depositing a secondary thin film, the depositing the HfSi$_x$O$_y$ film being performed by repeating the depositing the primary film and the secondary film once or more, the depositing the primary thin film step comprising:

feeding the first reactive gas by spraying TEMAH(Hf(($C_2H_5$)($CH_3$)N)$_4$) as the first reactive gas on the wafer through the first spray holes;

purging the first reactive gas by spraying an inert gas through all the spray holes of the shower head;

feeding the third reactive gas by spraying one of O$_3$ and H$_2$O as the third reactive gas on the wafer through the third spray holes; and purging the third reactive gas by spraying the inert gas through all the spray holes of the shower head, the depositing the primary thin film being performed by repeating the feeding the first reactive gas, the purging the first reactive gas, the feeding the third reactive gas, and the purging the third reactive gas a plurality of (N) times, the depositing the secondary thin film comprising:

feeding the second reactive gas by spraying one of TMDSO(O(Si(CH$_3$)$_2$H)$_2$) and HMDS((CH$_3$)$_3$)Si)$_2$) as the second reactive gas on the wafer through the second spray holes;

purging the second reactive gas by spraying the inert gas through all the spray holes of the shower head;

feeding the third reactive gas by spraying one of O$_3$ and H$_2$O on the wafer through the third spray holes; and purging the third reactive gas by spraying the inert gas is sprayed through all the spray holes of the shower head, the depositing the secondary thin film being performed by repeating the feeding the second reactive gas, the purging the second reactive gas, the feeding the third reactive gas, and the purging the third reactive gas a plurality of (M) times, wherein while a corresponding reactive gas is being sprayed through one of the first spray holes, the second spray holes, and the third spray holes, the inert gas is sprayed through the other two types of spray holes.

2. The method of claim 1, wherein the inert gas is sprayed through a plurality of gas curtain holes, which are further included in the shower head, toward the inner sidewalls of the reactor block so as to minimize deposition of the thin film on the inner sidewalls of the reactor block, wherein the depositing the HfSi$_x$O$_y$ film is performed while the inert gas is being sprayed through the gas curtain holes.

3. The method of claim 2, wherein the wafer mounted on the wafer block is heated at a temperature of approximately 80° C. to 600° C.

4. The method of claim 2, wherein the first reactive gas, the second reactive gas, and the third reactive gas are transferred to the reaction chamber through gas lines that are heated at a temperature of approximately 200° C. or less.

5. The method of claim 2, wherein when depositing the HfO$_2$ film, the reaction chamber is held at a pressure of approximately 0.1 Torr to 10 Torr.

6. The method of claim 2, wherein liquid materials of the first reactive gas are contained in a canister that is heated at a temperature of approximately 18° C. to 150° C.

7. The method of claim 2, wherein the first spray holes for spraying the first reactive gas are identical to the second spray holes for spraying the second reactive gas.

8. The method of claim 1, wherein the wafer mounted on the wafer block is heated at a temperature of approximately 80° C. to 600° C.

9. The method of claim 1, wherein the first reactive gas, the second reactive gas, and the third reactive gas are transferred to the reaction chamber through gas lines that are heated at a temperature of approximately 200° C. or less.

10. The method of claim 1, wherein depositing the HfSi$_x$O$_y$ film, the reaction chamber is held at a pressure of approximately 0.1 Torr to 10 Torr.

11. The method of claim 1, wherein liquid materials of the first reactive gas are contained in a canister that is heated at a temperature of approximately 18° C. to 150° C.

12. The method of claim 1, wherein the first spray holes for spraying the first reactive gas are identical to the second spray holes for spraying the second reactive gas.

13. A method of depositing a thin film using a hafnium compound on a wafer, the thin film being formed of $HfO_2$ using a reaction chamber comprising a reactor block in which a wafer block is received; a top lid for covering the reactor block to maintain a predetermined pressure; and a shower head installed under the top lid and including a plurality of first spray holes for spraying a first reactive gas on the wafer, a plurality of second spray holes for spraying a second reactive gas on the wafer, and a plurality of gas curtain holes for spraying an inert gas toward the inner sidewalls of the reactor block so as to minimize deposition of the thin film on the inner sidewalls of the reactor block, the method comprising:

mounting the wafer on the wafer block; and depositing the $HfO_2$ film by spraying reactive gases on the wafer, the depositing the $HfO_2$ film being performed while the inert gas is being sprayed through the gas curtain holes toward the inner sidewalls of the reactor block so as to minimize deposition of the thin film on the inner sidewalls of the reactor block, the depositing the $HfO_2$ film comprising:

feeding the first reactive gas by spraying TEMAH (Hf $((C_2H_5)(CH_3)N)_4$)) as the first reactive gas on the wafer through the first spray holes;

purging the first reactive gas by spraying the inert gas through all the spray holes of the shower head;

feeding the second reactive gas by spraying one of $O_3$ and $H_2O$ as the second reactive gas on the wafer through the second spray holes; and purging the second reactive gas by spraying the inert gas through all the spray holes of the shower head, the depositing the $HfO_2$ film being performed by repeating the feeding the first reactive gas, the purging the first reactive gas, the feeding the second reactive gas, and the purging the second reactive gas once or more, wherein while a corresponding reactive gas is being sprayed through one of the first spray holes and the second spray holes, the inert gas is sprayed through the other type of spray holes.

14. The method of claim 13, wherein the wafer mounted on the wafer block is heated at a temperature of approximately 80° C. to 600° C.

15. The method of claim 13, the first reactive gas and the second reactive gas are transferred to the reaction chamber through gas lines that are heated at a temperature of approximately 200° C. or less.

16. The method of claim 13, wherein when depositing the $HfO_2$ film, the reaction chamber is held at a pressure of approximately 0.1 Torr to 10 Torr.

17. The method of claim 13, wherein liquid materials of the first reactive gas are contained in a canister that is heated at a temperature of approximately 18° C. to 150° C.

* * * * *